(12) United States Patent
Ushijima

(10) Patent No.: US 7,510,967 B2
(45) Date of Patent: Mar. 31, 2009

(54) METHOD FOR MANUFACTURING SEMICONDUCTOR DEVICE

(75) Inventor: Kousei Ushijima, Kumamoto (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 115 days.

(21) Appl. No.: 11/802,841

(22) Filed: May 25, 2007

(65) Prior Publication Data

US 2007/0275558 A1    Nov. 29, 2007

(30) Foreign Application Priority Data

May 29, 2006    (JP) .............................. 2006-147731

(51) Int. Cl.
*H01L 21/44* (2006.01)
*H01L 21/311* (2006.01)
*H01L 21/4763* (2006.01)

(52) U.S. Cl. ..................... 438/656; 438/648; 438/672; 438/696; 438/597; 257/E21.224; 257/E21.597

(58) Field of Classification Search ................ 438/648, 438/656, 618, 672, 689, 696, 738; 257/E21.224, 257/E21.241, E21.597
See application file for complete search history.

(56) References Cited

U.S. PATENT DOCUMENTS 6,143,658 A * 11/2000 Donnelly et al. ............ 438/687
6,784,095 B1 * 8/2004 Pangrle et al. .............. 438/637
6,846,756 B2 * 1/2005 Pan et al. .................... 438/798
6,972,258 B2 * 12/2005 Chu et al. .................... 438/689
7,232,757 B2 * 6/2007 Noguchi et al. ............. 438/687
7,405,168 B2 * 7/2008 Lee et al. .................... 438/781

FOREIGN PATENT DOCUMENTS

JP        10-154694      6/1998
JP        2004-235344    8/2004

* cited by examiner

*Primary Examiner*—Alexander G Ghyka
*Assistant Examiner*—Seahvosh J Nikmanesh
(74) *Attorney, Agent, or Firm*—McGinn IP Law Group, PLLC

(57) ABSTRACT

The present invention relates to a method for manufacturing a semiconductor device, comprising: forming a metal interconnect on a substrate; forming a refractory metal layer containing titanium (Ti) or tantalum (Ta) on a surface of the metal interconnect; forming an insulating interlayer so as to cover the refractory metal layer; selectively etching the insulating interlayer with an etchant gas containing an organic fluoride to form a hole, in which the refractory metal layer is exposed; treating an interior of the hole with an organic chemical solution to remove fluorinated compounds of Ti or Ta while leaving fluorocarbons on the surface of the refractory metal layer, the fluorinated compounds of Ti or Ta and the fluorocarbons being created during the etching step and present in the interior of the hole; and performing plasma-treatment for the interior of said hole to remove the fluorocarbon.

6 Claims, 5 Drawing Sheets

METHOD FOR MANUFACTURING SEMICONDUCTOR DEVICE

This application is based on Japanese patent application No. 2006-147,731, the content of which is incorporated hereinto by reference.

BACKGROUND

1. Technical Field

The present invention relates to a method for manufacturing a semiconductor device. Specifically, the present invention relates to a method for manufacturing a semiconductor device having an interconnect structure, in which a refractory metal layer containing titanium (Ti) or tantalum (Ta) is provided on a metal interconnect when an interconnect layer for mutually coupling elements is formed on an upper portion of the substrate having a semiconductor device formed therein.

2. Related Art

In recent years, in response to increasing of integrations and operating speeds of semiconductor devices, reductions in interconnect resistances and in interconnect capacitances are required. Further, in semiconductor devices having multiple-layered interconnect structures, aluminum, copper or the like is employed for an interconnect material, and in such configuration, a barrier metal layer is generally provided for preventing metal elements from diffusing into an insulating film.

Japanese Laid-Open Publication No. 2004-235,344 discloses a technique for removing fluorocarbon by performing a treatment with an organic chemical solution between a plasma etching process and an ashing process, so as to inhibit an emission of active species of fluorine or fluorocarbon emitted from a resist in the ashing process.

Japanese Laid-Open Publication No. H10-154,694 discloses a method for manufacturing a semiconductor integrated circuit device including a resist-reproduction process, in which a first photo resist for employing a patterning of an aluminum thin film containing at least one of silicon and copper is removed, and then a second photo resist is applied on such aluminum thin film.

Meanwhile, when larger number of half-finished products are present in the practical manufacturing process, a stand-by time between operations may often be increased. In the manufacturing process described in Japanese Laid-Open Publication No. 2004-235,344, some products in some production lots are in a condition of being left for longer duration of time since a treatment with an organic chemical solution after a plasma etching step is finished until the next ashing step is started. In this case, exposed portions of a metal nitride film disposed in the bottom of the via is oxidized by being exposed for a long time with water in an atmospheric air.

In case that the exposed portions of the metal nitride film of the via bottom are oxidized, a resistance of via (via resistance) as being applied by a voltage may possibly increase at the time of filling a via hole with, for example, tungsten to form the via. As a result, a reliability of the obtained semiconductor device may often be reduced.

Conventionally, a certain limitation in time for starting from the treatment with organic chemical solution until ending the ashing step and a certain process control between steps are required for preventing an oxidization in the exposed portion of a metal nitride film of the via bottom, leading to a decrease in the productivity.

On the other hand, it is also considered that an oxide film on a surface of the metal nitride film in the via bottom may be restored to the original state by a reduction process. Nevertheless, the oxide film on the surface of the metal nitride film in the via bottom is in a so-called "rusted" condition, and the level of unevenness in the surface is influenced by: (1) a quantity of water contained in atmospheric air in a manufacturing line; (2) a quantity of electric charge accumulated in an interconnect; (3) quantities of titanium fluorides (hereinafter generally referred to as "TiF") and titanium oxyfluorides (hereinafter generally referred to as "TiOF") in the exposed portions, or the like, and forms of the unevenness are various, and larger level of unevenness may often provide a complete cavity formed therein. It is difficult that oxidized titanium is restored to the original state of titanium (Ti) including a geometry of a titanium layer before being oxidized. More specifically, it is required to prevent an oxidization of the via bottom for providing an improved reliability of the semiconductor device.

The present invention is established on the basis of such technical problems, and an object of the invention is to provide a technique, which is capable of eliminating needs for a certain limitation in time for starting from the treatment with organic chemical solution until ending the ashing step after etching step for forming the via hole and a certain process control between steps, and of preventing an oxidization of a metallic nitride film of the via bottom.

SUMMARY

According to one aspect of the present invention, there is provided a method for manufacturing a semiconductor device, comprising: forming a metal interconnect on a substrate; forming a refractory metal layer containing titanium (Ti) or tantalum (Ta) on a surface of the metal interconnect; forming an insulating interlayer so as to cover the refractory metal layer; selectively etching the insulating interlayer with an etchant gas containing an organic fluoride to form a hole, in which the refractory metal layer is exposed; treating an interior of the hole with an organic chemical solution to remove fluorinated compounds of Ti or Ta while leaving fluorocarbons on the surface of the refractory metal layer, the fluorinated compounds of Ti or Ta and the fluorocarbons being generated during the etching step and present in the interior of the hole; and performing plasma-treatment for the interior of said hole to remove the fluorocarbon.

The method for manufacturing a semiconductor device according to the present invention includes treating an interior of the hole with an organic chemical solution to remove fluorinated compounds of Ti or Ta while leaving fluorocarbons on the surface of the refractory metal layer, the fluorinated compounds of Ti or Ta and the fluorocarbons being generated during the etching step and present in the interior of the hole. It results to a removal of a fluorinated compound of Ti or Ta, thereby providing an enhanced cleanliness of the metal interconnect. Further, fluorocarbon, which exhibits hydrophobicity, is left, so that an adsorption of water is inhibited, thereby inhibiting oxidization of the metal interconnect. Thereafter, fluorocarbon is removed to allow obtaining a clean metal interconnect, thereby inhibiting an increase in the via resistance.

According to the present invention, the cleanliness of the metal interconnect is enhanced while preventing oxidization of the metal interconnect, so that an increase in the via resistance between the metal interconnect and the coupling plug can be inhibited.

As described above, the method for manufacturing the semiconductor device according to the present invention involves treating with an organic chemical solution of the present invention to remove fluorinated compounds of Ti or Ta while leaving fluorocarbons, so that a growth of $Ti_xO_y$ or $Ta_xO_y$ is inhibited even if the device is left in an atmospheric air for longer term, which leads to an inhibition of an increase in a via resistance, thereby avoiding a deterioration in the quality of the obtained semiconductor device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations of methods for manufacturing semiconductor devices according to the present invention will be described in reference to the annexed figures. In all figures, identical numeral is assigned to an element commonly appeared in both of the description of the present invention the description of the related art, and the detailed description thereof will not be repeated.

Figure 5:
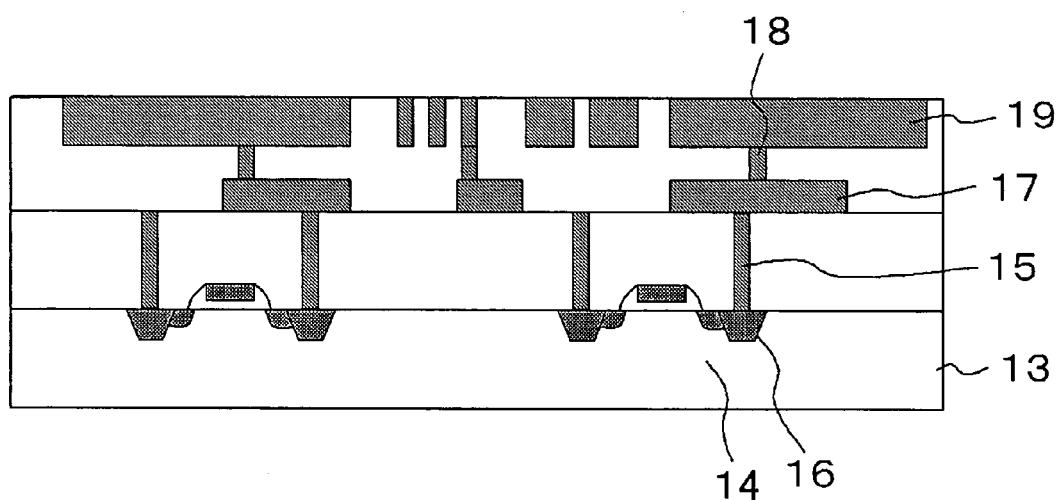
FIG. 5 is a cross-sectional view of an interconnect layer applied on a transistor according to an embodiment of the present invention.

FIG. 5 is schematic diagram of a semiconductor device according to the present embodiment. In FIG. 5, a transistor 14 is formed in a front surface of a silicon substrate 13. Contact plugs 15 are provided so as to be in contact with an upper portion of an impurity diffusion layer 16 that constitutes the transistor 14, and aluminum (Al) interconnects 17 are further formed on an upper surface of the contact plug 15. Al interconnects 19 are coupled to the Al interconnects 17 through via plugs 18. The method for manufacturing the semiconductor device according to the present embodiment comprises the following steps:

(i) forming a metal interconnect on the upper portion of the substrate;

(ii) forming a refractory metal layer containing Ti or Ta on the surface of the metal interconnect;

(iii) forming an insulating interlayer so as to cover the refractory metal layer;

(iv) selectively etching the insulating interlayer with an organic fluoride to form a hole, in which the refractory metal layer is exposed;

(v) treating an interior of the hole with an organic chemical solution to remove fluorinated compounds of Ti or Ta while leaving fluorocarbons thereon, the fluorinated compounds of Ti or Ta and the fluorocarbons being generated during the etching step and present in the interior of the hole; and (vi) performing plasma-treatment for the interior of the hole to remove the fluorocarbon.

The method for manufacturing the semiconductor device according to the present embodiment further comprises (vii) forming an electrically conducting film in the hole to create a coupling plug that is coupled to the metal interconnect. Respective steps will be described as follows.

Figure 1A:
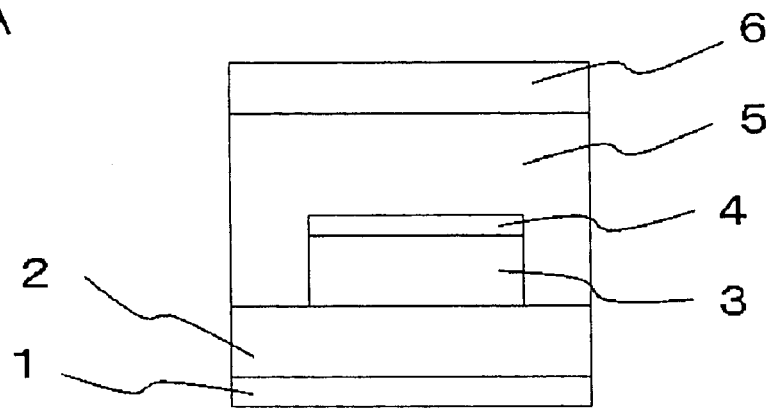
FIGS. 1A to 1C are cross-sectional views of a semiconductor device, showing an embodiment of a method for manufacturing a semiconductor device according to the present invention, in which an exemplary implementation for forming a via on the semiconductor substrate having a metal interconnect 3 serving as an inter-layer interconnect formed therein is shown.

As shown in FIG. 1A, an insulating interlayer 2 is formed on the substrate 1, and metal interconnect 3 containing aluminum (Al) as a major constituent is formed on the insulating interlayer 2 via a titanium nitride layer (step (i)), and then a titanium nitride layer 4 is deposited on the surface thereof (step of forming titanium nitride layer, step (ii)). In addition to above, elements (not shown) are previously formed in such substrate 1. Subsequently, an insulating interlayer 5 is deposited so as to cover the titanium nitride layer 4 (step forming insulating layer, step (iii)). Further, a resist 6 is formed on the surface of the insulating interlayer 5 (step of forming resist layer). Here, the metal interconnect 3 additionally includes, though it is not shown, a barrier metal layer for preventing the interconnect material from diffusing to the insulating interlayer 2. Typical metallic elements available for the metal interconnect include noble metals such as copper and the like, in addition to aluminum. Typical materials available for the barrier metal layer include a combination of titanium nitride (TiN, top)/titanium (Ti, bottom).

Typical refractory metal layers containing Ti or Ta employed in the step (ii) include, in addition to TiN, TiN/Ti, Ti, tantalum nitride (TaN), TaN/Ta and Ta.

Figure 1B:
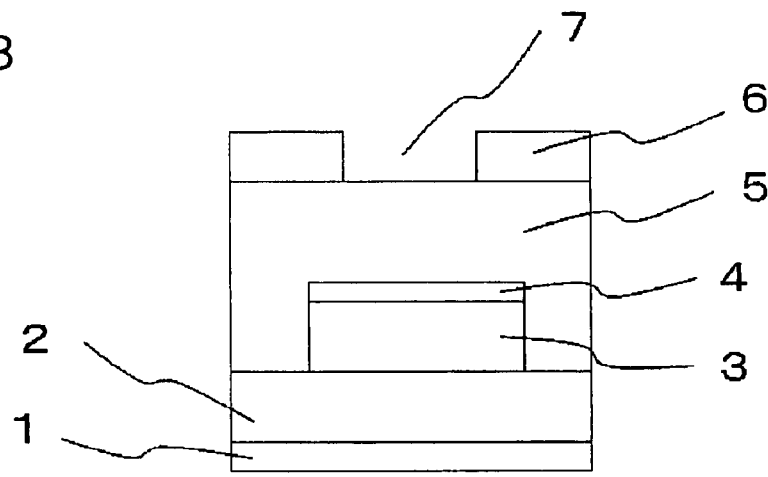
Figure 1C:
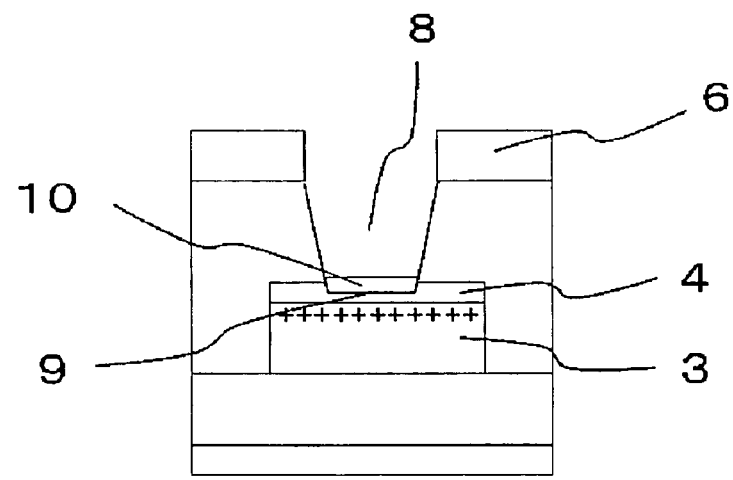

Subsequently, as shown in FIG. 1B, the resist 6 is patterned to form an opening region 7. Sequentially, the insulating interlayer 5 is processed by plasma-etching technique through a mask of the remained portions of the pattered resist 6 under the ordinary dry-etching conditions such as, for example, employing a parallel-plate plasma etcher at a temperature of around 0° C. to 100° C. with an etchant gas containing an organic fluoride, and applying a level of electric power, which is commonly employed in an ordinary dry etching technique, to an upper electrode and a lower electrode, so that a hole 8 is formed as shown in FIG. 1C (step of etching, step (iv)). Such etching step is designed to end the steps when the TiN layer 4 is exposed.

Typical organic fluorides used in the present invention may include compounds represented by $C_nF_{2n+2}$ (n is an integer number). Examples of such fluorocarbon may include octafluoropropane ($C_3F_8$), tetrafluoromethane ($CF_4$) or the like. In the present embodiment, $CF_4$ may be employed.

At this time, an altered layer 10, which is formed from carbon (C), Fluorine (F), titanium (Ti) and oxygen (O), is depended on an exposed portion 9 of the TiN layer 4 serving as a via bottom.

Subsequently, the altered layer 10 is treated with an organic chemical solution (step (v)). In this step, an organic chemical solution (thinner, for example) is dropped on the surface of the wafer by using, for example, a coating machine, while rotating the wafer. After the dropping of the organic chemical solution, wafer is rotated at a rotating rate of 3,000 rotations per minute (rpm) for shaking the chemical solution off the surface of the wafer. Such step is suitably controlled so as to remove titanium fluorides (TiF) or titanium oxyfluorides (TIOF) from the altered layer 10 and to leave $C_xF_y$ deposits (titanium fluorides is hereinafter generally referred to as "TiF", and titanium oxyfluorides is hereinafter generally referred to as "TiOF"). Time required for treating with the organic chemical solution and the Rotating rate of the wafer may be suitably selected such that an increase in the via resistance is inhibited based on the graphs of FIGS. 3 and 4.

Subsequently, a plasmas-treatment at a high temperature is performed (step (vi)). Here, a plasma-treatment is continued by introducing oxygen gas into a chamber at a substrate temperature of, for example, 200° C. or higher for 30 seconds or longer. When a parallel-plate plasma etcher is employed, the plasma-treatment is performed by applying an arbitrary electric power to the upper electrode and applying, for example, electric power of 500 Watts or higher to the lower electrode.

Figure 2A:
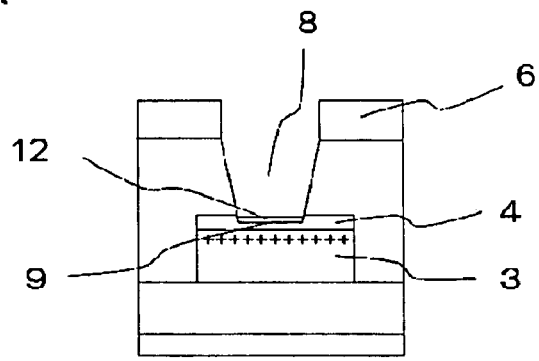
FIGS. 2A to 2D are cross-sectional views of the semiconductor device, showing the embodiment of the method for manufacturing the semiconductor device according to the present invention, in which the exemplary implementation for forming the via on the semiconductor substrate having the metal interconnect 3 serving the an inter-layer interconnect formed therein is shown.

As such, the stripping step is performed with the elevated temperature plasma, so that a reactivity of oxygen radical is increased, thereby allowing a removal of the $C_xF_y$ deposits and the resist (FIG. 2A).

Figure 2B:
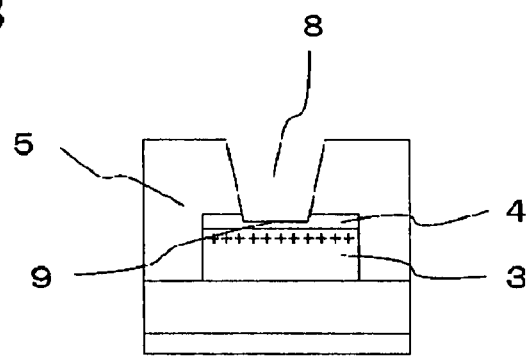
Figure 2C:
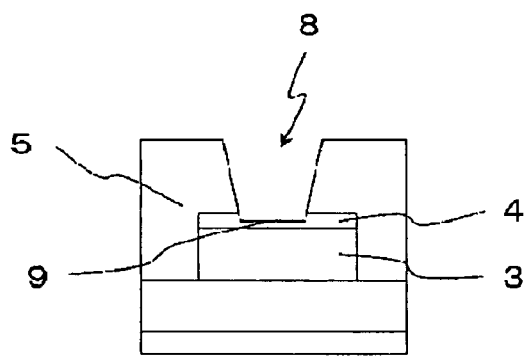

Further, an ultra-violet treatment by irradiation from a predetermined ultra-violet ray source is additionally performed, so that a removal of a static electricity can be achieved from the metal interconnect 3, which is susceptible to be positively charged after the etching step (FIGS. 2B and 2C), thereby reducing a formation and a growth of the altered layer at this stage.

Figure 2D:
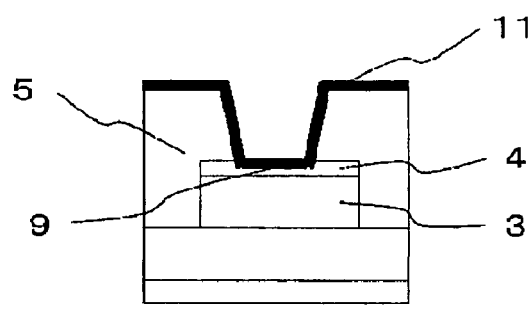

After the via hole is formed in such manner, titanium nitride or the like is deposited in the via to form a TiN layer 11 as shown in FIG. 2D, and then a step of forming a via is performed to form a via. Further, the formed via hole is filled with a metal (e.g., tungsten) to form a via plug.

Advantageous effects obtainable by employing a configuration according to the present embodiment will be described hereinafter.

In the present embodiment, the treatment with the organic chemical solution after the etching step allows modifying of the altered layer 10 in the exposed portion 9 of the TiN film 4 to an altered layer 12, which includes the exposed portion 9 that is not easily oxidized. Thus, even if the wafer is left for longer term until the next step is started, an oxidization of the exposed portion 9 of the TiN layer 4 can be prevented. More specifically, since the via bottom is coated with the $C_xF_y$ deposits that is not easily oxidized until the plasma stripping operation is ended (FIG. 2B), an oxidization is not caused even if the device is left in an atmospheric air, so that an increase in the via resistance is inhibited, thereby avoiding a deterioration in the quality of the semiconductor device.

Further, in the present embodiment, the inhibition of a growth of the $Ti_xO_y$ in the via bottom eliminates the needs for a certain limitation in time until the plasma stripping step, which has been recognized to be conventionally required, and for a certain process control between the steps, leading to an advantageous improvement in the productivity.

Although the method described in the above listed Japanese Laid-Open Publication No. 2004-235,344 involves removing fluorocarbons for the purpose of inhibiting generation of active species of fluorine or fluorocarbons from the resist employed in the ashing step on the contrary to the above-described present embodiment (see paragraph 0018 of '344), the present inventors have confirmed that the via bottom is oxidized by leaving the wafer in an atmospheric air until the next ashing step is started, since the $C_xF_y$ deposits are not remained.

Japanese Laid-Open Publication No. H10-154,694 discloses a typical method for manufacturing the semiconductor device, including a step of treating with an organic chemical solution, which is a method for manufacturing a semiconductor integrated circuit device including an operation for dissolving a first photo resist into a thinner. This method only allows dissolving the photo resist, and the above-described advantageous effects according to the present embodiment is not obtained, since it is difficult to remove the fluorinated compounds of Ti and to leave fluorocarbon, which is intended to be performed in the present embodiment.

Here, the organic chemical solution of the present embodiment will be described. The organic chemical solution (also referred to as "thinner") employed in the present embodiment exhibits, after forming the via, properties of: (1) being capable of removing TiF or TiOF; (2) having al rate of removing the $C_xF_y$ deposits, which is slower than the rate of removing TiF or TiOF; and (3) containing substantially no water, such that the via bottom having the exposed portion 9 of the exposed TiN layer 4 that is not easily oxidized can be realized.

In addition to above, if treatment with organic chemical solution has been performed for longer duration time so as to remove all the $C_xF_y$ deposits, the exposed portion 9 is in contact with water in an atmospheric air, so that the above-described advantageous effects are lost. It is needless to point out that optimizing of time for treating with the organic chemical solution should be determined in advance by conducting experiments or the like. Further, since (3) the thinner itself contains substantially no water, an oxidization due to a presence of water is not caused.

Concerning the organic chemical solution employed in the present embodiment, the term "contains substantially no water" means a water content in the organic chemical solution, which does not induce an oxidization of Ti. A solubility of the organic chemical solution in water (at 25°C. may be preferably equal to or lower than 5 g/100 g water, and more preferably equal to or lower than 3 g/100 g water.

Preferable examples of the organic chemical solution employed in the present embodiment includes propylene glycol monomethyl ether acetate (PGMEA) or butyl acetate or the like. These organic chemical solutions may be employed alone, or in a form of a combination thereof. An use of such organic chemical solution allows a removal of TiF or TiOF and a remaining of $C_xF_y$ deposits. Further, since the organic chemical solutions substantially contain no water, an oxidization of the TiN layer is inhibited.

A mechanism of oxidizing the exposed TiN layer with water to form titanium oxide ($Ti_xO_y$) will be described as follows.

First of all, when the exposed portion 9 of the exposed TiN layer 4 is left in an atmospheric air, a phenomenon that Ti is oxidized (rusted) is caused. This is equivalent to the phenomenon that iron would be rusted when being left in an atmospheric air.

Stages of an oxidation (rusting) of Ti will be shown in the following chemical formulas. Here, titanium oxide is represented as $TiO_2$ for the purpose of simplicity.

$$Ti+4H_2O \rightarrow Ti(OH)_4+2H_2$$

$$Ti(OH)_4 \rightarrow TiO_2+2H_2O$$

The above-described chemical formulas show a stage of reaction of Ti with water ($H_2O$), in which titanium hydroxide ($Ti(OH)_4$) is once created, and then water is eliminated to obtain titanium oxide ($TiO_2$). That is to say, water (moisture) is required for forming of $Ti_xO_y$.

Next, another critical scientific knowledge is that, if Ti is positively charged, reaction rate of:

$$Ti+4H_2O \rightarrow Ti(OH)+2H_2$$

is infinitely increased. That is to say, positive charge serves as accelerating a formation of $Ti_xO_y$.

Since the via hole is formed by sputtering ion positively charged in the etch operation onto the surface of the wafer, the whole interconnect 3 including the TiN layer 4 is also positively charged. Thus, since the whole interconnect 3 is positively charged after the etching step (FIG. 1C) and before the ultra-violet treatment (FIG. 2C) for performing the ultra-violet treatment by irradiating an ultra-violet ray from an ultra-violet light source, it is considered that the exposed portion 9 of the exposed TiN layer 4 is in a condition of easily be oxidized.

Further, another critical scientific knowledge of properties of TiF, TiOF, and $C_xF_y$ deposits contained in the altered layer of the via bottom will be described.

First of all, TiF and TiOF are hydrophilic compounds, and serve to absorb water from an atmospheric air. In particular TiF exhibits deliquescency (a property of absorbing water vapor in an atmospheric air, and being dissolved therewith and creating a water solution), and thus easily absorb water from an atmospheric air, so that TiF serves to accelerate a formation of $Ti_xO_y$.

On the contrary, it is known that $C_xF_y$ deposits are hydrophobic compounds. In other words, $C_xF_y$ deposits "repels" water in an atmospheric air, and serve to inhibit a formation of $Ti_xO_y$. More specifically, a suitable component of the altered layer for providing the exposed portion 9 of the exposed TiN layer 4 that is not easily oxidized contains smaller amount of TiF and TIOF, and larger amount of $C_xF_y$ deposits. While the above descriptions have been made in relation to Ti, Ta may be alternatively employed instead of Ti.

Preferred Embodiments

Preferred embodiments will be described as follows. It is not intended that the present invention is limited to the following examples.

EXAMPLE 1

The treating time and rotation speed of the wafer for achieving a removal of TiF or TiOF from the altered layer 10 and a remaining of $C_xF_y$ deposits were obtained as follows.

Figure 3:
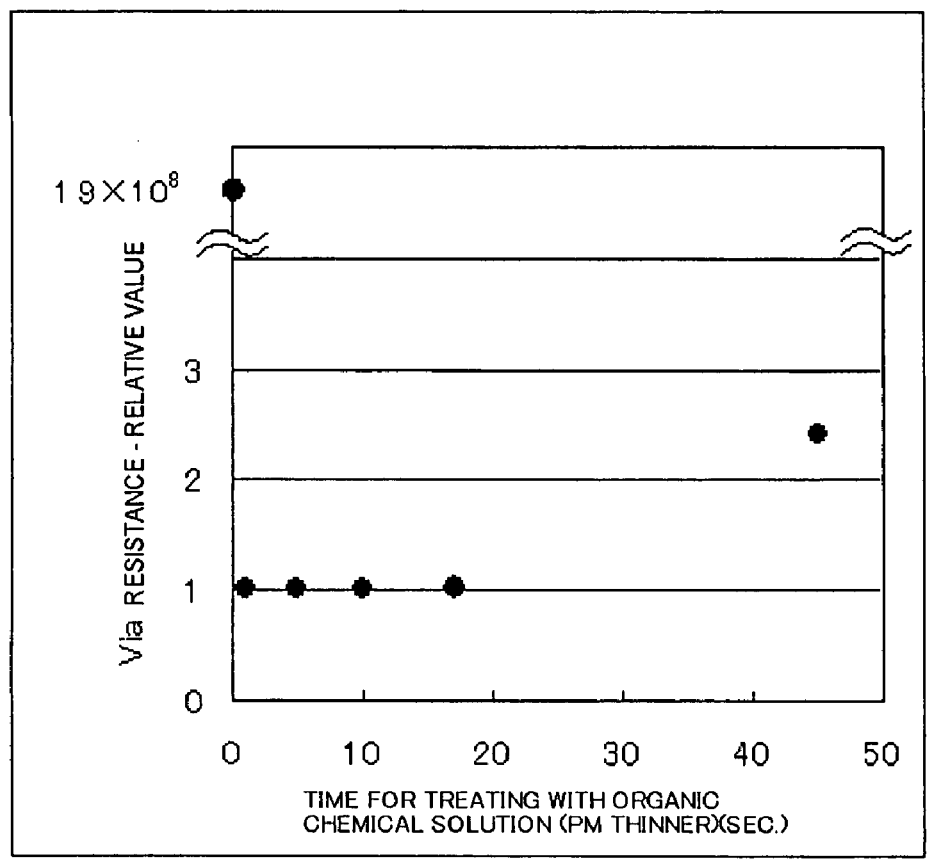
FIG. 3 is a graph, showing a relative value of a via resistance as a function of time (sec.) for treating with an organic chemical solution.
Figure 4:
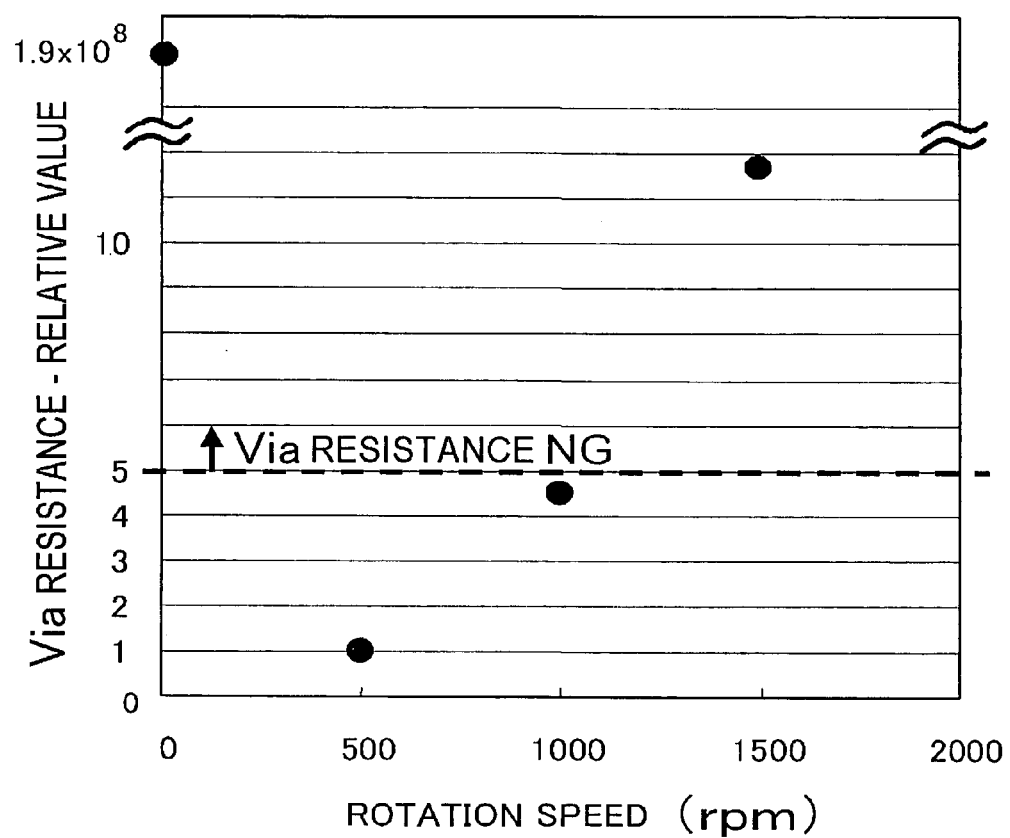
FIG. 4 is a graph, showing a relative value of a via resistance as a function of a rotation speed of a wafer (rpm)

FIG. 3 and FIG. 4 are graphs, showing a relationship of a time for treating with an organic chemical solution and rotation speed with a via resistance. These were obtained using the following conditions. organic chemical solution: PM thinner (component: PGMEA, aqueous solubility 1 g/(100 g water) (25° C.)); insulating interlayer: $SiO_2$ (oxide film); etchant gas: gaseous mixture of $CF_4/O_2/Ar$; metal interconnect: AlCu (copper-containing aluminum); substrate size: 8 inches; and refractory metal layer: TiN. The experimental process was as follows: A metal interconnect was formed on a substrate, and a TiN layer was formed on the surface of the metal interconnect. An interlayer insulating film was formed on the surface of the TiN layer, and was selectively etched with an etchant gas to form a hole. The interior of the hole was treated with an organic chemical solution by using a spin coating method to remove fluorinated compounds of Ti while leaving fluorocarbons on the surface of the TiN layer, the fluorinated compounds of Ti and the fluorocarbons being present in the interior of the hole.

Thereafter, the hole is subjected to plasma-treatment to remove fluorocarbon, and the hole is filled to form an electrically conducting film, and then an electrical resistance between the electrically conducting film and the metal interconnect was measured.

Horizontal axis of FIG. 3 represents a time (sec) for treatment with an organic chemical solution, and ordinate represents a relative value of a via resistance, in which a via resistance is normalized to 1 for five seconds of the treating time. Horizontal axis of FIG. 4 represents a rotation speed (rpm), and ordinate is a relative value of a via resistance, in which a via resistance is normalized to 1 for 500 rpm of the rotation speed. The relative values of the via resistance in cases of the rotation speeds of 0, 500, 1,000 and 1,500 rpm were, $1.9 \times 10^8$, 1, 4.5 and 11.7, respectively. FIG. 3 shows that a longer treating time of exceeding 45 seconds provides an increase in the via resistance, since $C_xF_y$ deposits disappears.

FIG. 4 shows that a higher rotation speed of exceeding 1,000 rpm provides an increase in the via resistance.

The present example clarified that a suitable rotation speed is 500 to 1,000 rpm, and a suitable dripping quantity is about 100 ml/min, and a preferable dripping time is 1 to 45 seconds, and more preferably 1 to 17 seconds. After the dipping of the organic chemical solution, for shaking the chemical solution off the wafer surface, the wafer was rotated at 3,000 rpm.

EXAMPLE 2

Components of the deposit component in the via bottom before and after treating with the PM thinner (treating time=17 seconds) were measured and compared by X-ray photoelectron spectroscopy analysis (XPS analysis), and in the composition ratio, TiF or TiOF was decreased by 42% and $C_xF_y$ deposit was decreased by 29%.

EXAMPLE 3

Via plugs obtained with the following process conditions were evaluated on the via resistances. organic chemical solution: PM thinner (component: PGMEA, aqueous solubility 1 g/(100 g water) (25° C.)); insulating interlayer: $SiO_2$ (oxide film);

etchant gas: gaseous mixture of $CF_4/O_2/Ar$; metal interconnect: AlCu (copper-containing aluminum); substrate size: 8 inches; and refractory metal layer: TiN. The experimental process was as follows: A metal interconnect was formed on a substrate, and a TiN layer was formed on the surface of the metal interconnect.

An interlayer insulating film was formed on the surface of the TiN layer, and was selectively etched with an etchant gas to form a hole. The interior of the hole was treated with an organic chemical solution by employing a spin coat method to remove fluorinated compounds of Ti while leaving fluorocarbons on the surface of the TiN layer, the fluorinated compounds of Ti and the fluorocarbons being present in the interior of the hole.

Thereafter, the hole is subjected to plasma-treatment for removing fluorocarbon, and the hole is filled to form an electrically conducting film, and then an electrical resistance between the electrically conducting film and the metal interconnect was measured.

EXAMPLE 4

Via plugs were manufactured similarly as in Example 3, except that butyl acetate (aqueous solubility 2.2 g/(100 g water)) was employed as the organic chemical solution.

COMPARATIVE EXAMPLE 1

Via plugs were manufactured similarly as in Example 3, except that a treatment with an organic chemical solution was not performed.

COMPARATIVE EXAMPLE 2

Via plugs were manufactured similarly as in Example 3, except that a stripping solution containing dimethylsulfoxide, hydroxylamine and water (at a range of from 15 to 25%) was employed in place of the organic chemical solution of Example 2.

COMPARATIVE EXAMPLE 3

Via plugs were manufactured similarly as in Example 3, except that a stripping solution containing dimethylsulfoxide, ammonium fluoride and water (at about 30%) was employed, in place of the organic chemical solution of Example 2.

Results

Resistances were measured at 112 points on a wafer surface per one wafer and average resistances were obtained, for the wafers obtained in Examples 3 and 4, and Comparative Examples 1 to 3. A comparison of the via resistances (average resistances) shows that the resistance of the device obtained in Comparative Example 1 was eight times as high as the resistances of the devices obtained in Examples 3 and 4, the resistance of the device obtained in Comparative Example 2 was four times as high as the resistances of the devices obtained in Examples 3 and 4, and that the resistance of the device obtained in Comparative Example 3 was twice as high as the resistances of the devices obtained in Examples 3 and 4.

It is apparent that the present invention is not limited to the above embodiment, and may be modified and changed without departing from the scope and spirit of the invention.

What is claimed is:

1. A method for manufacturing a semiconductor device, comprising:

forming a metal interconnect on a substrate;

forming a refractory metal layer containing titanium (Ti) or tantalum (Ta) on a surface of said metal interconnect;

forming an insulating interlayer so as to cover said refractory metal layer;

selectively etching said insulating interlayer with an etchant gas containing an organic fluoride to form a hole, in which the said refractory metal layer is exposed;

treating an interior of said hole with an organic chemical solution to remove fluorinated compounds of Ti or Ta while leaving fluorocarbons on the surface of said refractory metal layer, said fluorinated compounds of Ti or Ta and said fluorocarbons being generated during said etching step and present in the interior of said hole; and performing plasma-treatment for the interior of said hole to remove the fluorocarbon.

2. The method for manufacturing the semiconductor device according to claim 1, further comprising forming an electrically conducting film in said hole to form a coupling plug that is coupled to said metal interconnect.

3. The method for manufacturing the semiconductor device according to claim 1, wherein said refractory metal layer is a Ti-containing layer, said organic chemical solution is capable of removing a fluorinated compound of Ti, and said organic chemical solution is lower in a removing rate of fluorocarbon than said fluorinated compound of Ti.

4. The method for manufacturing the semiconductor device according to claim 1, wherein said organic chemical solution contain substantially no water.

5. The method for manufacturing the semiconductor device according to claim 1, wherein said organic chemical solution is propylene glycol monomethyl ether acetate (PGMEA).

6. The method for manufacturing the semiconductor device according to claim 1, wherein said organic chemical solution is butyl acetate.

* * * * *